United States Patent
Qi et al.

(10) Patent No.: US 11,973,150 B2
(45) Date of Patent: Apr. 30, 2024

(54) SOLAR CELL AND SOLAR CELL MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Peidong Qi, Zhejiang Providence (CN); Tingting Li, Zhejiang Providence (CN); Wusong Tao, Zhejiang Providence (CN); Hui Li, Zhejiang Providence (CN); Chenzhao Yang, Zhejiang Providence (CN)

(73) Assignees: Shanghai Jinko Green Energy Enterprise Management Co., Ltd., Shanghai (CN); Zhejiang Jinko Solar Co., Ltd., Zhejiang (CN)

( * ) Notice: Subject to any disclaimer, the term of this patent is extended or adjusted under 35 U.S.C. 154(b) by 0 days.

(21) Appl. No.: 17/489,597

(22) Filed: Sep. 29, 2021

(65) Prior Publication Data
US 2023/0068031 A1 Mar. 2, 2023

(30) Foreign Application Priority Data
Aug. 27, 2021 (CN) .......................... 202110996489.2

(51) Int. Cl.
*H01L 31/02* (2006.01)
(52) U.S. Cl.
CPC .... *H01L 31/0201* (2013.01); *H01L 31/02021* (2013.01)

(58) Field of Classification Search
CPC ........... H01L 31/0201; H01L 31/02021; H01L 31/0512; H01L 31/0547; H01L 31/0488;
(Continued)

(56) References Cited

U.S. PATENT DOCUMENTS

| 2015/0068592 A1 | 3/2015 | Kommera et al. |
| 2015/0270410 A1* | 9/2015 | Heng ..................... H02S 40/36 136/251 |

(Continued)

FOREIGN PATENT DOCUMENTS

| CN | 103715279 A | 4/2014 |
| CN | 206931608 U | 1/2018 |

(Continued)

OTHER PUBLICATIONS

Translation of CN-110277460.*

(Continued)

*Primary Examiner* — Uyen M Tran
(74) *Attorney, Agent, or Firm* — Knobbe, Martens, Olson & Bear, LLP

(57) ABSTRACT

Provided is a solar cell and a solar cell module. The solar cell includes a converging busbar. The converging busbar separates a first surface of the solar cell into a first region and a second region. The first region includes a plurality of first sub-busbars spaced along a first direction and a plurality of main busbars spaced along a second direction, and the main busbar is electrically connected to the first sub-busbar. The second region includes a plurality of second sub-busbars spaced along a third direction. The converging busbar is located between the first region and the second region, and is electrically connected to the plurality of main busbars and the plurality of second sub-busbars.

15 Claims, 6 Drawing Sheets

(58) Field of Classification Search
CPC ......... H01L 31/0508; H01L 31/022433; Y02E 10/50
See application file for complete search history.

(56) References Cited

U.S. PATENT DOCUMENTS

| | | | |
|---|---|---|---|
| 2016/0155865 A1* | 6/2016 | Bitnar | H01L 31/022433 |
| | | | 136/256 |
| 2017/0243992 A1 | 8/2017 | Rostan et al. | |
| 2020/0279966 A1 | 9/2020 | Lyu et al. | |
| 2020/0373448 A1 | 11/2020 | Kyeong et al. | |

FOREIGN PATENT DOCUMENTS

| | | |
|---|---|---|
| CN | 110277460 A | 9/2019 |
| CN | 110459618 A | 11/2019 |
| CN | 209729932 U | 12/2019 |
| CN | 210390448 U | 4/2020 |
| CN | 210866208 U | 6/2020 |
| CN | 111490108 A | 8/2020 |
| CN | 112289874 A | 1/2021 |
| CN | 112768389 A | 5/2021 |
| EP | 3496160 A1 | 6/2019 |
| JP | S61-231774 A | 10/1986 |
| JP | 11186572 A | 7/1999 |
| JP | 2013039158 A | 2/2013 |
| JP | 2014029934 A | 2/2014 |
| JP | 2020189240 A | 11/2020 |
| WO | 2013039158 A1 | 3/2013 |
| WO | 2020189240 A1 | 3/2020 |
| WO | 2021008474 A1 | 1/2021 |

OTHER PUBLICATIONS

Translation of CN 210866208.*
Extended European Search Report of Application No. 21200324.8-1230 (reference No. 442700498EP), dated Apr. 3, 2022, in 9 pages.
First Office Action of Japanese Application No. 2021-159501, dated Nov. 2, 2021, in 13 pages.
Chinese Office Action received in Application 2021109964892 dated Apr. 27, 2023 in 11 pages.

* cited by examiner

SOLAR CELL AND SOLAR CELL MODULE

CROSS-REFERENCE TO RELATED APPLICATIONS

The present application claims priority to Chinese Patent Application No. 202110996489.2, filed on Aug. 27, 2021, the content of which is incorporated herein by reference in its entirety.

TECHNICAL FIELD

The present disclosure relates to the field of solar cell technologies, and in particular, to a solar cell and a solar cell module.

BACKGROUND

So far, the photovoltaic industry has developed closer and closer to fair-price busbar purchase. However, in recent years, fluctuant prices of raw material have impeded the development of the industry. Reduction of consumption of raw materials to achieve cost reduction is an effective solution. Currently, with wide application of a multi-busbar (MBB) technology, consumption of solder strips and silver paste has been reduced. At the same time, the application of half-slice and multi-slice technologies can reduce hot spot influence of a photovoltaic module in an actual operating environment.

At present, technologies such as the MBB technology, half-slice, three-slice and the like have been widely used.

The existing cell screen printing plate design and layout design of cells in the module have been widely used. Under the existing busbar electrode design, it is difficult to reduce the consumption of silver paste, the price of silver powder continues to fluctuate, and costs are difficult to control. At the same time, consumption of existing solder strips has been basically finalized, and the cost of the solder strips also rises while the copper price rises. Cost control in the two directions has reached a certain bottleneck, which is difficult to solve under the existing design.

SUMMARY

An objective of the present disclosure is to provide a solar cell and a solar cell module, so as to solve the technical problems in the related art.

The present disclosure provides a solar cell, including a converging busbar. The converging busbar separates a first surface of the solar cell into a first region and a second region. The first region is located on a first side of the converging busbar, and the second region is located on a second side of the converging busbar. The first region includes a plurality of first sub-busbars spaced along a first direction and a plurality of main busbars spaced along a second direction, and the plurality of main busbars are electrically connected to the plurality of first sub-busbars. The second region includes a plurality of second sub-busbars spaced along a third direction. The converging busbar is electrically connected to the plurality of main busbars and the plurality of second sub-busbars.

In an embodiment, the first direction is perpendicular to an extension direction of the converging busbar, and the second direction and the third direction are parallel to the extension direction of the converging busbar.

In an embodiment, a size of the solar cell satisfies a first formula: W1<W2. W1 denotes a length of the second sub-busbar, and W2 denotes a length of the main busbar.

In an embodiment, the size of the solar cell satisfies a second formula: W1=W3<W4. W3 denotes a length of the first sub-busbar close to a boundary of the solar cell; and W4 denotes a distance between two adjacent main busbars.

In an embodiment, the converging busbar separates a second surface of the solar cell into the first region and the second region. The first region on the second surface of the solar cell is located on the second side of the converging busbar, and the second region on the second surface of the solar cell is located on the first side of the converging busbar.

In an embodiment, in the first region, a plurality of shunt lines spaced along the first direction are provided between each two adjacent main busbars. One of the plurality of shunt lines is electrically connected to two adjacent first sub-busbars.

In an embodiment, a product of a spacing between two adjacent first sub-busbars and a spacing between two adjacent main busbars is greater than 15 mm$^2$ and less than 25 mm$^2$.

In an embodiment, a product of a spacing between two adjacent second sub-busbars and a length of the second sub-busbar is greater than 15 mm$^2$ and less than 25 mm$^2$.

The present disclosure further provides a solar cell module, including a plurality of solar cells distributed along a certain arrangement direction. Each of the plurality of solar cells is the solar cell described above. Adjacent solar cells of the plurality of solar cells is electrically connected through a solder strip. The main busbar on the first surface of a solar cell is fixedly connected to one end of the solder strip, and the main busbar on the second surface of another solar cell is fixedly connected to the other end of the solder strip.

In an embodiment, lengths of the solder strips located on two sides of the solar cell do not exceed ⅔ of a length of the solar cell in the first direction.

REFERENCE SIGNS

1: solar cell, 2: busbar electrode, 3: first region, 4: second region, 5: converging busbar, 6: first sub-busbar, 7: main busbar, 8: second sub-busbar, 9: solar cell body, 10: front electrode structure, 11: back electrode structure, 12: solder strip, 13: cell string, 14: solar cell module, 15: cell unit;

In the related art,

1': main busbar, 2': sub-busbar, 3': solder strip.

DETAILED DESCRIPTION

Embodiments described below with reference to the accompanying drawings are illustrative, are intended only to interpret the present disclosure and not to be interpreted as limitations on the present disclosure.

Figure 1:
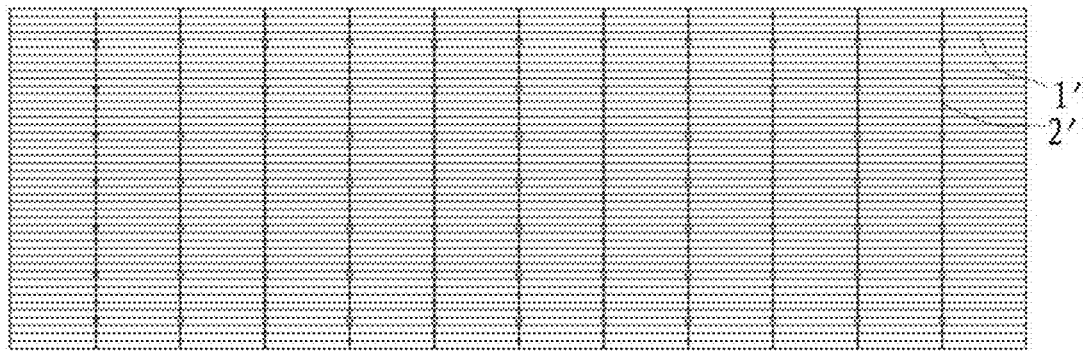
FIG. 1 is a schematic structural diagram of a multi-busbar electrode in the related art.
Figure 2:
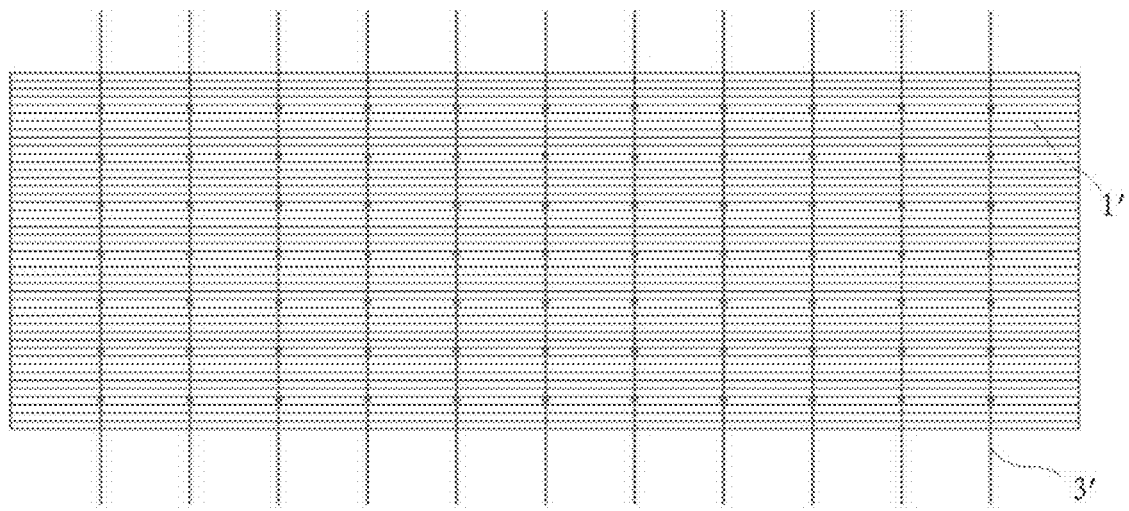
FIG. 2 is a schematic diagram of connections between three slices of a multi-busbar solar cell and solder strips in the related art.

Referring to FIG. 1 and FIG. 2, FIG. 1 is a schematic structural diagram of a multi-busbar electrode in the related art, and FIG. 2 is a schematic diagram of connections between three slices of a multi-busbar solar cell and solder strips in the related art. At the present stage, a conventional MBB cell screen printing plate is basically designed with sub-busbars 2' vertically arranged and main busbars 1' horizontally arranged. The sub-busbar 2' has a function of collecting a current generated by the solar cell under a lighting condition. The main busbar 1' mainly collects the current of the sub-busbar 2' and is connected to the solder strip 3' to transmit the current.

However, cost control in the two directions has reached a certain bottleneck, which is difficult to solve under the existing design.

Figure 3:
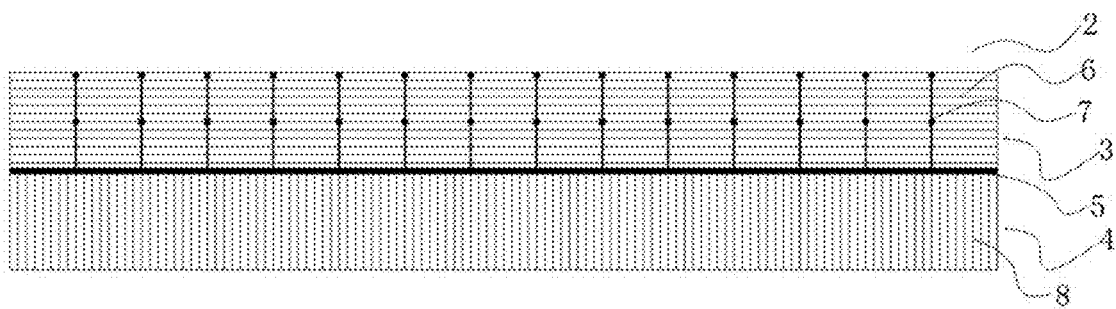
FIG. 3 is a schematic design diagram of a sub-busbar electrode according to the present disclosure.

As shown in FIG. 3, an embodiment of the present disclosure provides a solar cell 1. The solar cell 1 includes a busbar electrode 2. The busbar electrode 2 includes a converging busbar 5. The converging busbar 5 separates a first surface of the solar cell 1 into a first region 3 and a second region 4. The first region 3 is located on a first side of the converging busbar 5, and the second region 4 is located on a second side of the converging busbar 5. In the present embodiment, the first surface of the solar cell 1 is located on a front surface of the solar cell 1, and the second surface of the solar cell 1 is located on a back surface of the solar cell 1. Referring to FIG. 3, the first side of the converging busbar is located above the converging busbar 5 as illustrated, and the second side of the converging busbar 5 is located below the converging busbar 5 as illustrated. Those skilled in the art may know that positions of the first side and the second side of the converging busbar 5 may also be interchanged or otherwise set. For example, the first side of the converging busbar 5 is located below the converging busbar 5 as illustrated, and the second side of the converging busbar 5 is located above the converging busbar 5, which are not limited therein.

The first region 3 includes a plurality of first sub-busbars 6 spaced along a first direction and a plurality of main busbars 7 spaced along a second direction. The main busbar 7 is electrically connected to the first sub-busbar 6. The first sub-busbar 6 is configured to collect a photo-generated current in the first region 3. The main busbar 7 is configured to collect currents from the plurality of first sub-busbars 6.

The second region 4 includes a plurality of second sub-busbars 8 spaced along a third direction. The second sub-busbar 8 is configured to collect a photo-generated current in the second region 4. No main busbar 7 is provided on the second region 4.

The converging busbar 5 is located between the first region 3 and the second region 4, and is electrically connected to the plurality of main busbars 7 and the plurality of second sub-busbars 8. The converging busbar 5 collects a current of the second sub-busbar 8 and overlaps with the main busbar 7. An overlap portion plays a role of soldering, and the current is conducted by the main busbar 7 to the solder strip 12.

The busbar electrode 2 according to the present disclosure is designed to include a limited number of first sub-busbars 6, second sub-busbars 8 and main busbars 7. A width of the main busbar 7 and a number of soldering spots are not limited, subject to best matching the type and dimension of the solar cell 1 (for example, the number of the main busbars 7 matching the solar cell 1 of 210 mm is 12).

Based on the above embodiment, referring to FIG. 4, FIG. 5, FIG. 7 and FIG. 10, when two adjacent solar cells 1 are laid out in series, the solder strip 12 is welded to only a main solder wire on the first region 3, while no main solder wire exists in the second region 4, so as to achieve a purpose of saving the solder strip 12. The photo-generated current generated in the first region 3 on the solar cell 1 is first collected by the first sub-busbar 6, and then transferred to the main busbar 7 through the first sub-busbar 6. The main busbar 7 then transfers the current to the solder strip 12. The photo-generated current generated in the second region 4 on the solar cell 1 is first collected by the second sub-busbar 8 and then transferred to the converging busbar 5. The converging busbar 5 overlaps with the main busbar 7, and the current is transmitted to the solder strip 12 through the main busbar 7.

Further, a first given angle, a second given angle and a third given angle are maintained between the first direction, the second direction, the third direction and an extension direction of the converging busbar 5 respectively. The first direction is preferably parallel to a serial layout distribution direction of a plurality of solar cells 1. The second direction, the third direction and the extension direction of the converging busbar 5 are preferably perpendicular to the first direction. The first given angle is preferably 0°. The second given angle and the third given angle are preferably 90°. The first direction is perpendicular to the extension direction of the converging busbar 5. The second direction and the third direction are parallel to the extension direction of the converging busbar 5. In this way, during the layout and the connection with the solder strip 12, the solder strip 12 and the main busbar 7 have a minimum length, so as to achieve the purpose of saving the consumption of silver paste of the main busbar 7 and the consumption of the solder strip 12.

Figure 6:
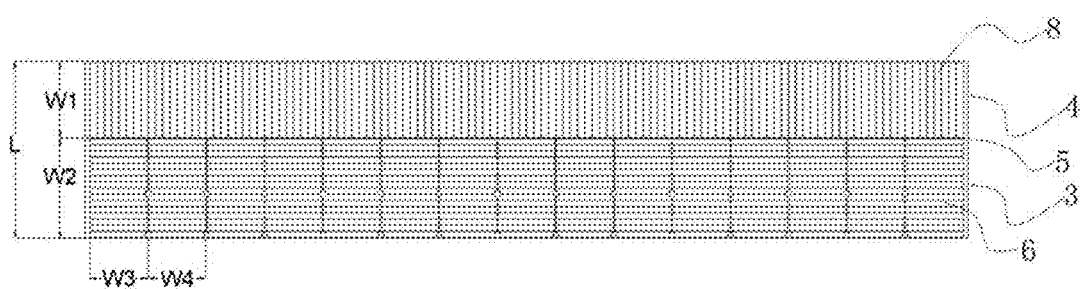
FIG. 6 is a design diagram of dimensions of the busbar electrode of the solar cell according to the present disclosure.

Further, referring to FIG. 6, a size of the busbar electrode 2 satisfies a first formula: $W1<W2$; where $W1$ denotes a length of the second sub-busbar, which is mainly related to current collection of the solar cell 1; and $W2$ denotes a length of the main busbar. $W2=L-W1$, where $L$ denotes a width of a slice of the solar cell, which is determined according to a size of the solar cell 1 and a number of required slices.

At the same time, the size of the busbar electrode 2 satisfies a second formula: $W1=W3<W4$; where $W3$ denotes a distance between the main busbar 7 close to a boundary of the busbar electrode 2 and the boundary of the busbar electrode 2, that is, a length of the first sub-busbars 6 on two sides of the solar cell 1 is mainly related to current collection of the solar cell 1; and W4 denotes a distance between two adjacent main busbars 7.

The length W1 of the second sub-busbars vertically distributed and the length W3 of the second sub-busbars horizontally distributed on two sides may be regarded as a distance from an edge of the solar cell 1 to the main busbar 7. If W1 and W3 are too wide, it may lead to a defect caused by a poor transfer effect of the current after being collected at the edge of the solar cell 1. Combined with W4, that is, the width between two main busbars 7, W1, W3 and W4 are the furthest transfer distance of the current in each part (that is, the loss of current transfer within the distance is minimum). In order to ensure maximum efficiency of current collection, a relationship among W1, W3 and W4 is roughly W1=W3<maximum effective transfer distance=W4. By taking the solar cell 1 of 182 mm as an example, it is designed as a six-slice solar cell 1. A width of a slice of the solar cell 1 is L=30.33 mm, the number of the main busbar 7 is 11, a spacing W4 of the main busbar 7 is about 16 mm, and correspondingly, W1=W3=12 mm and W2=18.33 mm.

Further, the second sub-busbar 8 has no solder points, which does not require soldering and reduces a risk of soldering micro-cracks. At present, a major difficulty encountered in mass production of N-type double-sided solar cells is a low process yield (the low process yield may affect productivity and a product yield), in which soldering micro-cracks account for a large proportion. During module manufacturing of the N-type double-sided solar cells, repair rate accounts for about 28%, in which soldering micro-cracks account for about 13%, cold solder joints account for 7%, offset of the solder strip 12 accounts for 5%, and others account for 3%. In the present embodiment, reduction of soldering spots means reduction of soldering difficulty, and the risk of soldering micro-cracks is reduced by about 30%. That is, the soldering micro-cracks can be reduced by 4%. At the same time, due to the reduction of the soldering spots, the risk of cold solder joints is reduced by about 30%. The length of the solder strip 12 used is reduced, and the risk of offset of the solder strip 12 is reduced by about 50%. Combined with the above aspects, the solar cell 1 is expected to reduce the repair rate by 8.5% in terms of module manufacturing, that is, a module manufacturing yield can be increased by about 30%, which further improves the productivity, increases the product yield, and reduces module manufacturing costs.

Figure 7:
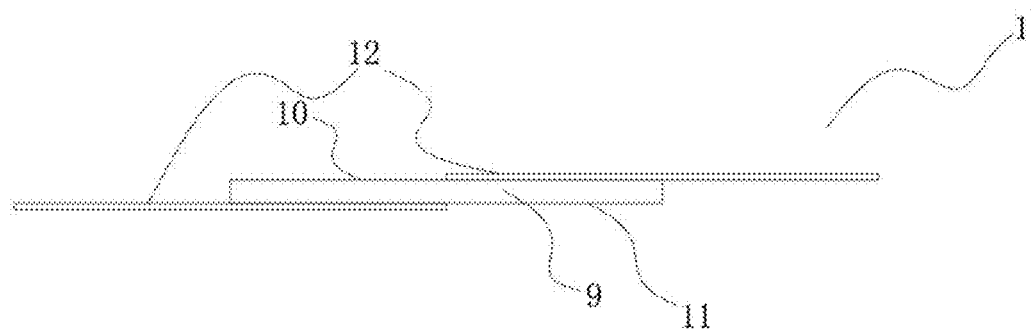
FIG. 7 is a side view of a single solar cell according to the present disclosure in a soldering state.

Furthermore, referring to FIG. 7, the solar cell 1 further includes a solar cell body 9, that is, a silicon wafer, which has an upper surface (that is, the first surface of the solar cell) and a lower surface (that is, the second surface of the solar cell) opposite to the upper surface; a front electrode structure 10 located on the upper surface of the solar cell body 9; and a back electrode structure 11 located on the lower surface of the solar cell body 9. The front electrode structure 10 and the back electrode structure 11 are formed by using the busbar electrode 2, and are made by drying and sintering a silver paste material printed through a pattern of the busbar electrode 2.

Figure 4:
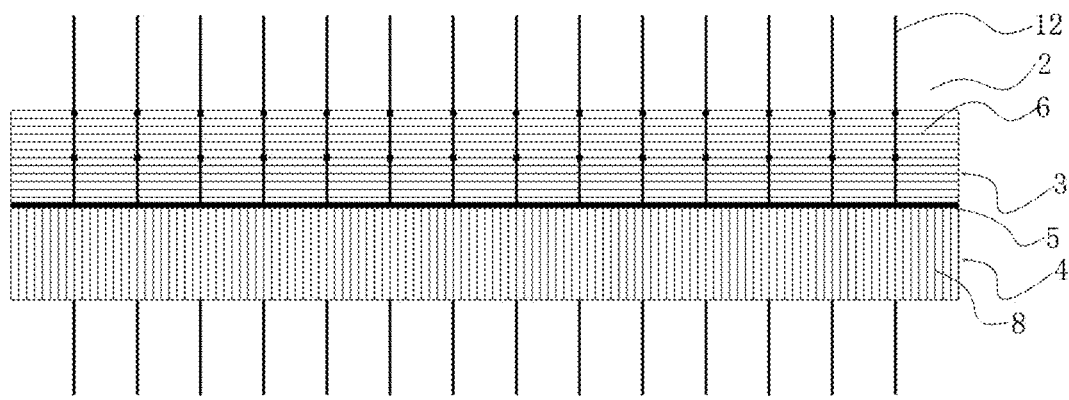
FIG. 4 is a schematic diagram of solder of a busbar electrode on one side of a solar cell to a solder strip according to the present disclosure.
Figure 5:
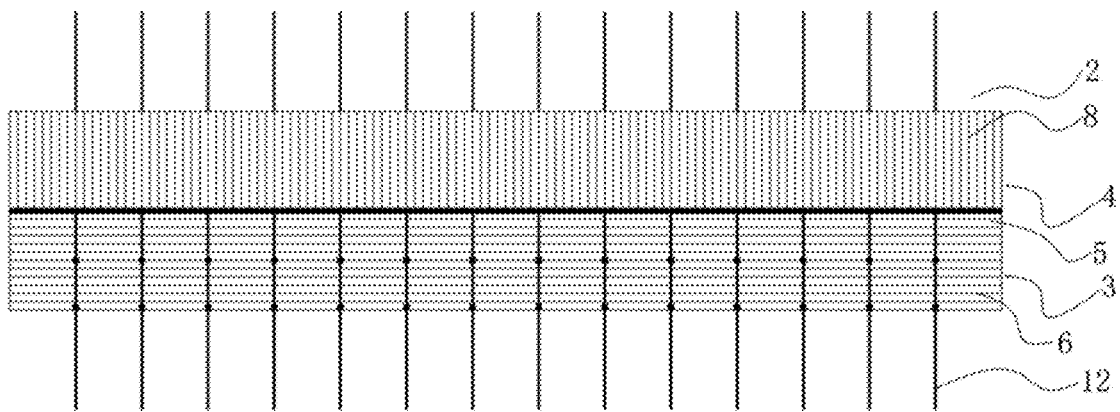
FIG. 5 is a schematic diagram of solder of a busbar electrode on the other side of the solar cell to the solder strip according to the present disclosure.

Further, referring to FIG. 4 and FIG. 5, the front electrode structure 10 and the back electrode structure 11 are arranged opposite to each other. The first region 3 on the second surface of the solar cell 1 is located on the second side of the converging busbar 5, and the second region 4 on the second surface of the solar cell is located on the first side of the converging busbar 5. That is, the first region 3 of the front electrode structure 10 corresponds to the second region 4 of the back electrode structure 11, and the second region 4 of the front electrode structure 10 corresponds to the first region 3 of the back electrode structure 11.

FIG. 7 is a side view of a single solar cell 1 in a soldering state. One solder strip 12 is welded to the main busbar 7 of the front electrode structure 10 on an upper side of the solar cell 1 and is not welded to the second sub-busbars 8 in the second region 4 on the back electrode structure 11. Another solder strip 12 is welded to the main busbar 7 of the back electrode structure 11 on a lower side of the solar cell 1 and is not welded to the second sub-busbars 8 in the second region 4 in the back electrode structure 11. In a conventional solution, the solder strip 12 substantially overlaps the whole region. Therefore, the consumption of the solder strip 12 required in the solution is reduced in part.

In a manufacturing process of the solar cell 1, a key point for implementation of the design solution of the solar cell 1 according to the present disclosure is to change the pattern of the busbar electrode 2. Only a printing procedure of the main busbar of the solar cell 1 is required to be changed. Corresponding laser grooving is performed according to the busbar electrode 2 of the present disclosure, and the corresponding busbar electrode 2 is customized and used for printing (screen printing or electroplating may be used in a screen printing plate process). Other cell processes such as diffusion and texturing are conventional.

In practical application, the busbar electrode 2 of the present disclosure may be used in sizes of 158.75 mm, 166 mm, 182 mm, 210 mm and so on, and a number of slices may also be half, three, four, . . . or n (n≥2). A technological improvement of the present disclosure is the printing process, which does not affect other processes, so it is compatible with mono-crystalline and polycrystalline solar cells, and P-type, N-type, HJT-type solar cells 1.

Figure 8:
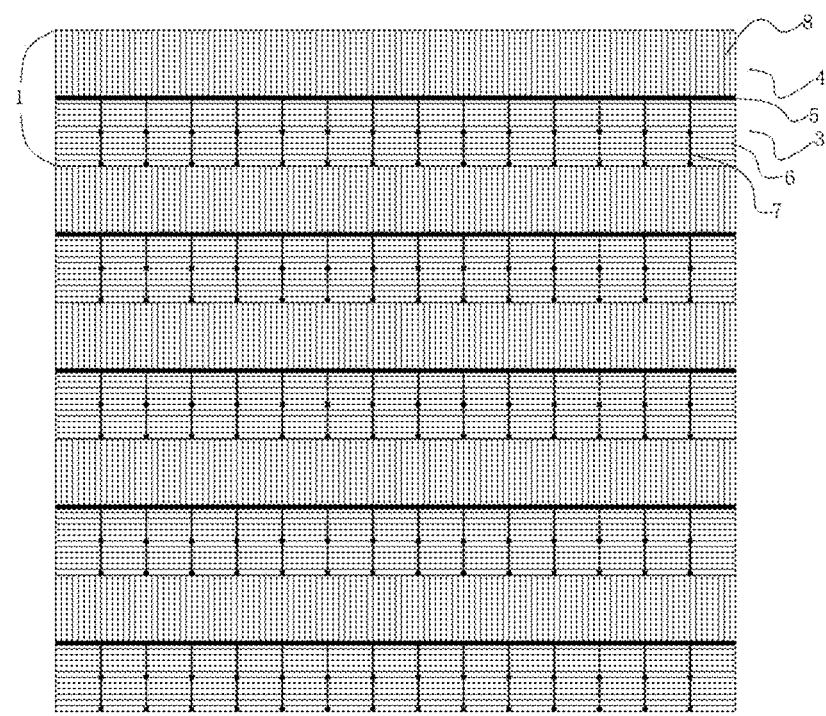
FIG. 8 is a schematic design diagram of a cell string according to the present disclosure.
Figure 9:
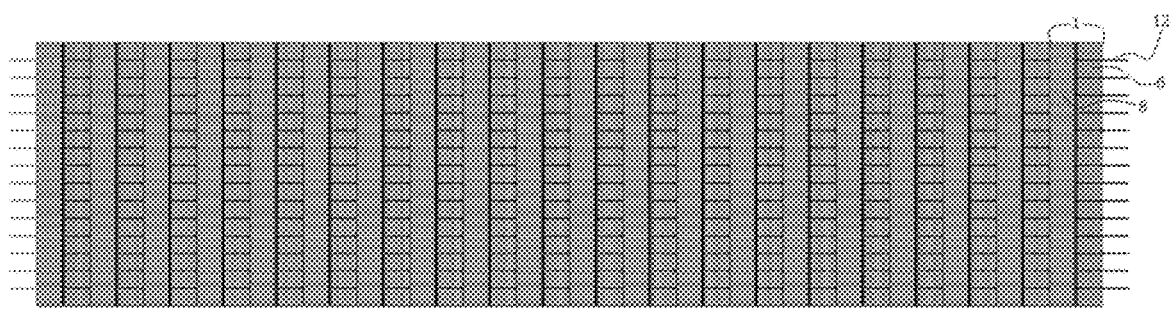
FIG. 9 is a top view of the cell string according to the present disclosure in the soldering state.
Figure 10:
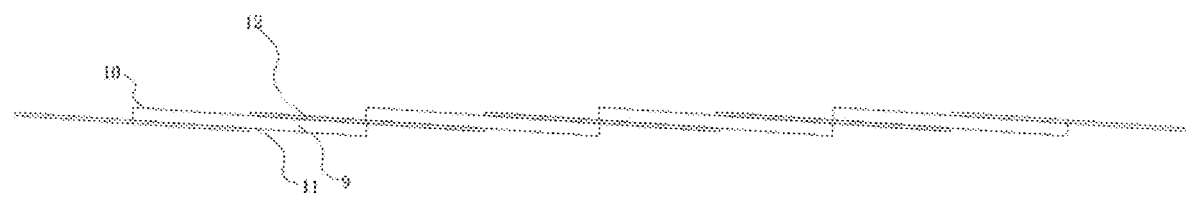
FIG. 10 is a side view of the cell string according to the present disclosure in the soldering state.
Figure 11:
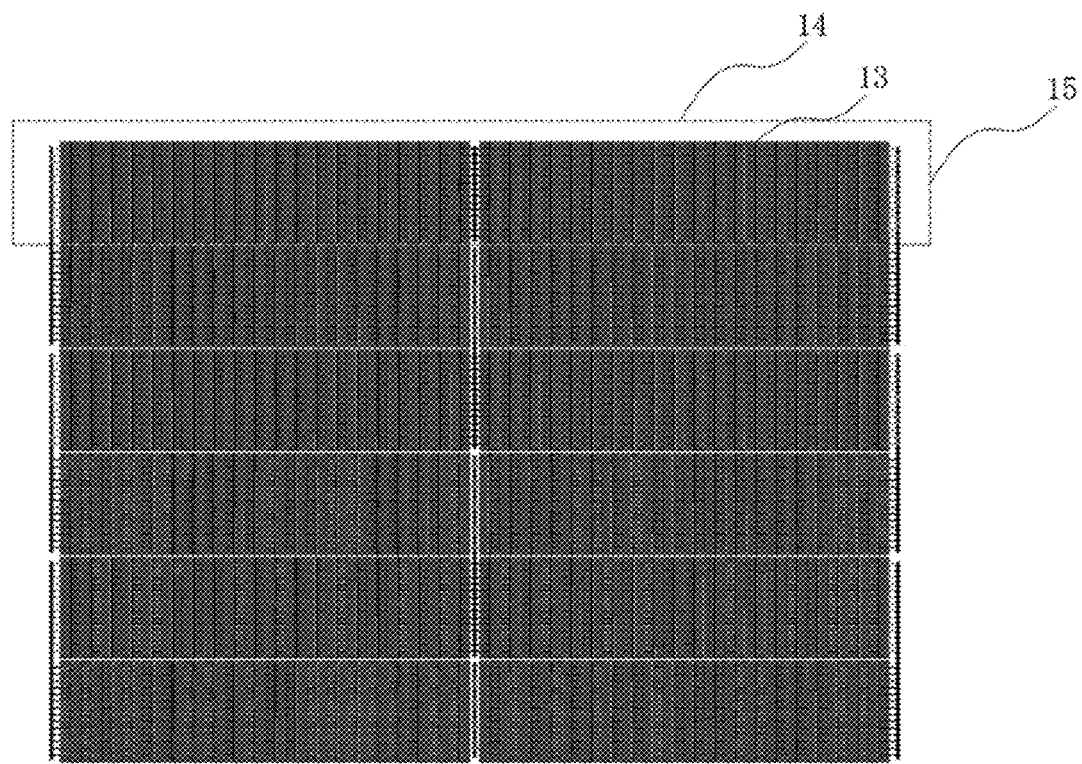
FIG. 11 is a layout diagram of a solar cell module according to the present disclosure.

Referring to FIG. 8 and FIG. 9, the solder strip 12 above the solar cell 1 is connected to a back surface of the previous solar cell 1, the solder strip 12 below the solar cell 1 is connected to a front surface of next solar cell 1, and the solar cells 1 are sequentially connected to form a plurality of solar cells 1 connected in series.

Compared with the solder strip 12 connected to the conventional solar cell 1, in the present disclosure, the solder strip 12 is required to be connected only to some regions of each solar cell 1. Generally, the solder strip 12 is required to be connected to all regions of each solar cell 1. Upon comparison, the length of the solder strip 12 in the solution of the present disclosure is required to be only about a part of the length of the solder strip in the conventional serial connection (if six slices of the solar cell of 182 mm have a width of 30.3 mm, the solder strip 12 has a length of about 40 mm, and the solder strip 12 required in the conventional connection is about 60 mm). That is, the total consumption of the solder strip 12 is only ⅔ of that in the conventional solution.

Based on the structure of the solar cell 1, referring to FIG. 8 to FIG. 12, an embodiment further provides a solar cell module 14. The solar cell module 14 includes a plurality of cell units 15 connected in series. Each of the cell units 15 includes two cell strings 13 connected in parallel. The cell string 13 includes a plurality of solar cells 1 distributed along a given arrangement direction. The solar cell 1 described above is adopted. The solar cell 1 is sliced to reduce an output current in a circuit, which increases an output voltage of the module, thereby reducing electric energy lost during current transfer. The solution of the connection between the solar cells 1 is implemented as follows. The solar cells 1 are all arranged with slices including the main busbar 7 facing a same direction. When the solder strip 12 is cut, the length of the solder strip 12 is about the width of the solar cell 1 used. During the placement of the solder strip 12, the solder strip 12 overlaps with and is welded to the main busbar 7. After the soldering, the cell string 13 can be used normally with its laid out designed in the module as required.

In an embodiment, referring to FIG. 4, FIG. 5, FIG. 7 and FIG. 10, adjacent solar cells 1 are electrically connected through the solder strip 12. The main busbar 7 of the front electrode structure 10 of the previous solar cell 1 is welded to one end of the solder strip 12, and the main busbar 7 of the back electrode structure 11 of the subsequent solar cell 1 is welded to the other end of the solder strip 12. Lengths of the solder strips 12 located on two sides of the solar cell 1 do not exceed ⅔ of a length of the solar cell 1 in the first direction. For example, the lengths of the solder strips 12 located on two sides of the solar cell 1 are equal to or greater than the length of the main busbar 7.

Furthermore, in the first region 3, a number of the first sub-busbar 6 between the main busbar 7 on the most lateral side and the edge of the solar cell 1 is greater than a number of the first sub-busbar 6 between two adjacent main busbars 7. The first sub-busbar 6 is densified at positions of edges around the solar cell 1. A main reason is that the first sub-main busbar 7 at the edge of solar cell 1 is required to avoid the chamfer region of the solar cell, so that the main busbar 7 at an outer most edge is far from the edge of the solar cell, and a dark region at an edge EL of the solar cell 1 appears. Therefore, the first sub-busbar 6 is densified at the edge of the solar cell 1 on the basis of the multi-main busbars, so that density of the first sub-busbar 6 at the edge of the solar cell 1 is increased to increase the capability of current collection.

Further, in the first region, a plurality of shunt lines spaced along the first direction are provided between each two adjacent main busbars 7, and the shunt line is electrically connected to two adjacent first sub-busbars 6. The shunt line has a width of 0.022 mm. The design of the shunt line effectively reduces the risk caused by abnormal printing quality such as busbar breakage and improves output power of the module. In the case of line breakage, few carriers may also be collected by the main busbar 7 along the first sub-busbar 6 in an equivalent and effective way to prevent busbar breakage of EL of the solar cell.

Further, the smaller the distance between two adjacent main busbars 7, the larger the distance between two adjacent first sub-busbars 6. At the same time, the smaller the length W1 of the second sub-busbar 8, the greater the spacing between the two adjacent second sub-busbars 8. A product of a spacing between two adjacent first sub-busbars 6 and a spacing between two adjacent main busbars 7 is greater than 15 mm$^2$ and less than 25 mm$^2$. At the same time, a product of a spacing between two adjacent second sub-busbars 8 and a length of the second sub-busbar 8 is greater than 15 mm$^2$ and less than 25 mm$^2$. The product is intended to determine an area of the current collected by the solar cell 1. Values of the spacing between two adjacent first sub-busbars 6 and the spacing between two adjacent second sub-busbars 8 are both in a range of 0.8 mm to 2.0 mm. For example, W4=16 mm, and the spacing between two adjacent first sub-busbars 6 is 1.637 mm. W1=12 mm, and the spacing between two adjacent second sub-busbars 8 is 1.68 mm. This reduces the number of sub-busbars while ensuring the capability of current collection. That is, unit consumption of the silver paste is reduced (in the above example, about two busbars are reduced, which means the amount of silver paste in the sub-busbars is reduced by about 2%). Currently, the conventional method of reducing the unit consumption of the silver paste has no improvement, and the present embodiment provides a new direction to reduce the unit consumption.

The sub-busbar of the conventional busbar electrode 2 is parallel to a long side direction of the solar cell 1, and the main busbar 7 is perpendicular to the long side direction. Front and back screen patterns are basically the same. In the present embodiment, since no main busbar 7 is designed in part of the upper surface and the lower surface of the solar cell body 9 in the busbar electrode 2, and the amount of silver paste of the main busbar 7 is reduced by about 30%. At the same time, compared with the conventional screen printing plate design, in the second region 4, no main busbar 7 is designed in part of the second sub-busbar 8 horizontally distributed and the solder strip 12 is designed, which can reduce the shielding of the main busbar 7 and bring certain power gain.

Figure 12:
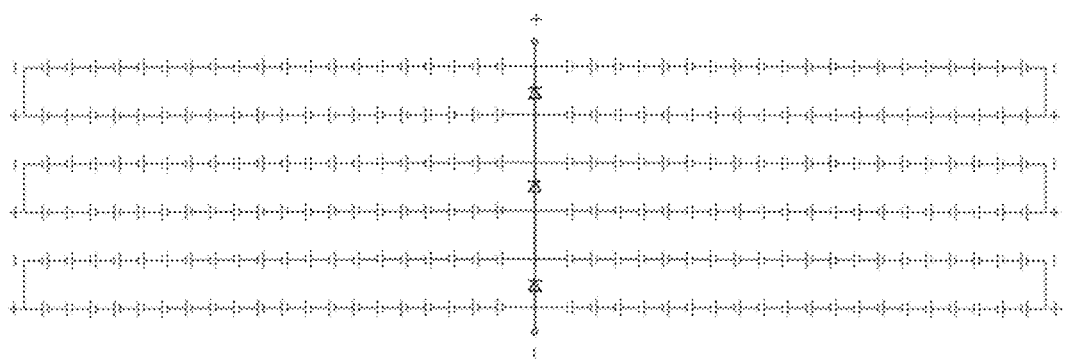
FIG. 12 is a circuit diagram of the solar cell module according to the present disclosure.

Referring to FIG. 12, a serial circuit after the solar cells 1 are sliced to be connected into strings is consistent with a conventional serial circuit. The strings formed by connection may be laid out and connected in a same manner as normal strings, which may be a layout diagram of a serial-parallel structure of 6 strings of half-slice modules as a normal module, and at the same time, may also be compatible with a structure of 5 strings. A plate type may be changed as required. Since the present disclosure is based on a multi-slice structure, an output voltage is directly proportional to the number of the slices of a single string. That is, the greater the number of the slices, the higher the voltage. In order to prevent a risk brought by a high voltage, the output voltage and the risk can be reduced by changing a serial-parallel structure of the module circuit layout, for example, combining a three-serial four-parallel structure. At the same time, the most direct solution is to reduce the number of slices of a single string, which is suitable for manufacturing of micro modules. The present disclosure focuses on screen printing plate design and serial connection design applied to multiple slices of the solar cell 1, which is subject to an actual requirement in actual use of module layout.

The structures, features and effects of the present disclosure are described in detail above according to the embodiments shown in the drawings. The above are only preferred embodiments of the present disclosure, but the present disclosure does not limit the scope of implementation as illustrated in the drawings. Any changes made in accordance with the conception of the present disclosure, or equivalent embodiments modified as equivalent changes, which still do not exceed the spirit covered by the specification and the drawings, shall fall within the protection scope of the present disclosure.

What is claimed is:

1. A solar cell, comprising a converging busbar, wherein the converging busbar separates a first surface of the solar cell into a first region and a second region, the first region is located on a first side of the converging busbar, and the second region is located on a second side of the converging busbar, and the converging busbar separates a second surface of the solar cell into a third region and a fourth region, the third region on the second surface of the solar cell is located on the second side of the converging busbar, and the fourth region on the second surface of the solar cell is located on the first side of the converging busbar, the first region comprises a plurality of first sub-busbars for collecting a photo-generated current of the first region and a plurality of main busbars, the plurality of first sub-busbars extends along a second direction and are spaced from one another along a first direction, and the plurality of first sub-busbars are parallel to the converging busbar, and the plurality of main busbars extends along the first direction and are spaced from one another along a second direction, and the plurality of main busbars are electrically connected to the plurality of first sub-busbars for collecting current of the plurality of first sub-busbars;

the second region comprises a plurality of second sub-busbars for collecting a photo-generated current of the second region, the plurality of second sub-busbars extends along the first direction and are spaced from one another along a third direction, the plurality of second sub-busbars are perpendicular to the converging busbar, and the second region does not have a main busbar; and the converging busbar is electrically connected to the plurality of second sub-busbars, and the plurality of main busbars are electrically connected to the converging busbar, wherein the first direction is perpendicular to an extension direction of the converging busbar, and the second direction and the third direction are parallel to the extension direction of the converging busbar, wherein the plurality of first sub-busbars are not directly connected to the plurality of second sub-busbars, wherein a size of the solar cell satisfies a first formula:

$$W1=W2<W3, \text{ and}$$

wherein W1 denotes a length of each second sub-busbar, W2 denotes a length of each first sub-busbar close to a boundary an edge of the solar cell, and W3 denotes a distance between two adjacent main busbars, wherein an arrangement on the second surface of the solar cell is in rotational symmetry with respect to an arrangement on the first surface of the solar cell along a virtual axis of the converging busbar.

2. The solar cell according to claim 1, wherein a size of the solar cell satisfies a second formula:

$$W1<W4;$$

wherein W4 denotes a length of each main busbar.

3. The solar cell according to claim 1, wherein a product of a spacing between two adjacent first sub-busbars and a spacing between two adjacent main busbars is greater than 15 mm² and less than 25 mm².

4. The solar cell according to claim 1, wherein a product of a spacing between two adjacent second sub-busbars and a length of each second sub-busbar is greater than 15 mm² and less than 25 mm².

5. A solar cell module, comprising a plurality of solar cells distributed along a certain arrangement direction, wherein each solar cell of the plurality of solar cells comprises:

a converging busbar, wherein the converging busbar separates a first surface of the solar cell into a first region and a second region, the first region is located on a first side of the converging busbar, and the second region is located on a second side of the converging busbar, and the converging busbar separates a second surface of the solar cell into a third region and a fourth region, the third region on the second surface of the solar cell is located on the second side of the converging busbar, and the fourth region on the second surface of the solar cell is located on the first side of the converging busbar, the first region comprises a plurality of first sub-busbars for collecting a photo-generated current of the first region and a plurality of main busbars, the plurality of first sub-busbars extends along a second direction and are spaced from one another along a first direction, and the plurality of first sub-busbars are parallel to the converging busbar, and the plurality of main busbars extends along the first direction and are spaced from one another along a second direction, and the plurality of main busbars are electrically connected to the plurality of first sub-busbars for collecting current of the plurality of first sub-busbars;

the second region comprises a plurality of second sub-busbars for collecting a photo-generated current of the second region, the plurality of second sub-busbars extends along the first direction and are spaced from one another along a third direction, the plurality of second sub-busbars are perpendicular to the converging busbar, and the second region does not have a main busbar; and the converging busbar is electrically connected to the plurality of second sub-busbars, and the plurality of main busbars are electrically connected to the converging busbar, wherein the first direction is perpendicular to an extension direction of the converging busbar, and the second direction and the third direction are parallel to the extension direction of the converging busbar, wherein the plurality of first sub-busbars are not directly connected to the plurality of second sub-busbars, wherein a size of the solar cell satisfies a first formula:

$$W1=W2<W3,$$

wherein W1 denotes a length of each second sub-busbar, W2 denotes a length of each first sub-busbar close to an edge of the solar cell, and W3 denotes a distance between two adjacent main busbars, and wherein adjacent solar cells of the plurality of solar cells are electrically connected through a solder strip, each main busbar on the first surface of a solar cell is fixedly connected to one end of the solder strip, and each main busbar on the second surface of another solar cell is fixedly connected to the other end of the solder strip, wherein an arrangement on the second surface of the solar cell is in rotational symmetry with respect to an arrangement on the first surface of the solar cell along a virtual axis of the converging busbar.

6. The solar cell module according to claim 5, wherein lengths of solder strips located on two sides of the solar cell do not exceed ⅔ of a length of the solar cell in the first direction.

7. The solar cell module according to claim 5, wherein a size of the solar cell satisfies a second formula:

$$W1<W4;$$

wherein W4 denotes a length of each main busbar.

8. The solar cell module according to claim 5, wherein a product of a spacing between two adjacent first sub-busbars and a spacing between two adjacent main busbars is greater than 15 mm² and less than 25 mm².

9. The solar cell module according to claim 5, wherein a product of a spacing between two adjacent second sub-busbars and the length of each second sub-busbar is greater than 15 mm² and less than 25 mm².

10. The solar cell according to claim 1, wherein the plurality of second sub-busbars have no solder points.

11. The solar cell module according to claim 5, wherein the plurality of second sub-busbars have no solder points.

12. The solar cell according to claim 1, wherein an arrangement on the third region of the second surface of the solar cell is opposite to an arrangement on the first region of the first surface of the solar cell, and an arrangement on the fourth region of the second surface of the solar cell is opposite to an arrangement on the second region of the first surface of the solar cell.

13. The solar cell module according to claim 5, wherein an arrangement on the third region of the second surface of the solar cell is opposite to an arrangement on the first region of the first surface of the solar cell, and an arrangement on the fourth region of the second surface of the solar cell is opposite to an arrangement on the second region of the first surface of the solar cell.

14. The solar cell according to claim 1, wherein, in the first region, a plurality of shunt lines spaced along the first direction are provided between each two adjacent main busbars, and one of the plurality of shunt lines is electrically connected to two adjacent first sub-busbars.

15. The solar cell module according to claim 5, wherein, in the first region, a plurality of shunt lines spaced along the first direction are provided between each two adjacent main busbars, and one of the plurality of shunt lines is electrically connected to two adjacent first sub-busbars.

* * * * *